US012803848B2

(12) United States Patent
Boehnke et al.

(10) Patent No.: US 12,803,848 B2
(45) Date of Patent: Nov. 17, 2026

(54) DEVICES AND METHODS FOR A DIRTY PAPER CODING SCHEME

(71) Applicant: HUAWEI TECHNOLOGIES CO., LTD., Shenzhen (CN)

(72) Inventors: Ronald Boehnke, Munich (DE); Muhammed Yusuf Sener, Munich (DE); Wen Xu, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 364 days.

(21) Appl. No.: 18/500,442

(22) Filed: Nov. 2, 2023

(65) Prior Publication Data

US 2024/0073066 A1 Feb. 29, 2024

Related U.S. Application Data

(63) Continuation of application No. PCT/EP2021/061739, filed on May 4, 2021.

(51) Int. Cl.
*H04L 25/03* (2006.01)
*H03M 13/07* (2006.01)
(Continued)

(52) U.S. Cl.
CPC ...... *H04L 25/03343* (2013.01); *H03M 13/07* (2013.01); *H04L 1/0041* (2013.01); *H04L 1/0057* (2013.01); *H04L 27/36* (2013.01)

(58) Field of Classification Search
CPC ..... H04W 24/02; H04W 28/16; H04W 24/10; H04W 16/10; G06N 20/00; G06N 7/01; G06N 3/09; G06N 3/08; G06N 3/0464; G06N 3/0495; G06N 3/045; G06N 3/047; H04L 27/2601; H04L 25/03165
See application file for complete search history.

(56) References Cited

U.S. PATENT DOCUMENTS 7,027,537 B1 * 4/2006 Cheong ................ H04L 1/0071 375/348
7,421,041 B2 * 9/2008 Khandekar ......... H04L 25/0238 375/345
(Continued)

OTHER PUBLICATIONS

Probabilistic Shaping and Forward Error Correction for Fiber-Optic Communication Systems; Georg Bocherer, et al.; Journal of Lightwave Technology, vol. 37, No. 2, Jan. 15, 2019; pp. 230-244 (Year: 2019).*
(Continued)

*Primary Examiner* — Jutai Kao
(74) *Attorney, Agent, or Firm* — Fish & Richardson P.C.

(57) ABSTRACT

The present disclosure relates to a dirty paper coding (DPC) scheme for a wireless communication system. One example encoding device obtains symbol probabilities for symbols of a symbol sequence given an effective interference based on a target distribution of symbols of a transmit signal, encodes a message into the symbol sequence based on the symbol probabilities, and then obtains the transmit signal based on a mapping of the symbol sequence and the effective interference using a scalar function. One example decoding device obtains a receive signal, obtains a symbol sequence based on the receive signal and a scaling factor using a scalar function, and then decodes the symbol sequence to obtain a message.

16 Claims, 16 Drawing Sheets

(51) Int. Cl.
*H04L 1/00* (2006.01)
*H04L 27/36* (2006.01)

(56) References Cited

U.S. PATENT DOCUMENTS

| | | | | |
|---|---|---|---|---|
| 8,254,484 | B2 * | 8/2012 | Kim | H04L 25/03343 370/335 |
| 9,184,876 | B2 * | 11/2015 | Orlik | H04L 1/0052 |
| 10,091,046 | B1 * | 10/2018 | Lefevre | H04L 27/36 |
| 11,923,881 | B2 * | 3/2024 | Kilian | H04L 1/20 |
| 2004/0028011 | A1 * | 2/2004 | Gehring | H04L 5/06 370/330 |
| 2004/0048574 | A1 * | 3/2004 | Walker | H03K 5/133 455/63.1 |
| 2005/0190868 | A1 * | 9/2005 | Khandekar | H04L 1/0071 375/346 |
| 2006/0172716 | A1 * | 8/2006 | Yoshii | H04L 27/2647 455/226.1 |
| 2007/0079742 | A1 * | 4/2007 | Liu | H04L 25/497 114/102.1 |
| 2008/0282126 | A1 * | 11/2008 | Chindapol | H04B 7/026 714/748 |
| 2009/0010359 | A1 * | 1/2009 | Hwang | H04W 52/42 375/297 |
| 2009/0274235 | A1 * | 11/2009 | Lee | H04L 5/023 375/267 |
| 2010/0074364 | A1 * | 3/2010 | Kwon | H04W 52/42 375/296 |
| 2010/0182950 | A1 * | 7/2010 | Sexton | H04L 27/0006 370/328 |
| 2011/0021153 | A1 * | 1/2011 | Safavi | H04L 1/0026 455/63.1 |
| 2014/0328278 | A1 * | 11/2014 | Sexton | H03M 7/30 370/329 |
| 2015/0110216 | A1 * | 4/2015 | Bajcsy | H04L 27/2654 375/348 |
| 2015/0311973 | A1 * | 10/2015 | Colavolpe | H04B 1/10 370/317 |
| 2016/0374116 | A1 * | 12/2016 | Sexton | H03M 7/30 |
| 2017/0331589 | A1 * | 11/2017 | Jang | H04L 1/0045 |
| 2017/0353340 | A1 * | 12/2017 | Raphaeli | H04L 27/3411 |
| 2018/0191457 | A1 * | 7/2018 | Wang | H04B 1/0028 |
| 2018/0367191 | A1 * | 12/2018 | Xia | H04B 7/0626 |
| 2021/0036727 | A1 * | 2/2021 | Kilian | H04L 1/20 |
| 2023/0188394 | A1 * | 6/2023 | Ait Aoudia | H04L 25/03165 375/260 |
| 2024/0007226 | A1 * | 1/2024 | Wu | H04L 1/0042 |
| 2024/0048430 | A1 * | 2/2024 | Wu | H04L 1/0058 |
| 2024/0073066 | A1 * | 2/2024 | Boehnke | H04L 1/0057 |
| 2024/0137253 | A1 * | 4/2024 | Wu | H04L 27/0012 |

OTHER PUBLICATIONS

Costa, "Writing on dirty paper," IEEE Transactions on Information Theory, vol. 29, No. 3, May 1983, pp. 439-441.

Böhnke et al. "Multi-Level Distribution Matching," IEEE Communications Letters, vol. 24, No. 9, Sep. 2020, pp. 2015-2019.

Tomlinson, "New automatic equaliser employing modulo arithmetic," Electronics Letters, vol. 7, Mar. 25, 1971, pp. 138-139.

Şener et al., "Dirty Paper Coding Based on Polar Codes and Probabilistic Shaping," IEEE Communications Letters, vol. 25, No. 12, Dec. 2021, pp. 3810-3813.

Harashima et al., "Matched-Transmission Technique for Channels With Intersymbol Interference," IEEE Transactions on Communications, vol. 20, No. 4, Aug. 1972, pp. 774-780.

Shilpa et al., "Dirty Paper Coding using Sign-bit Shaping and LDPC Codes," CoRR, submitted on Jan. 20, 2010, arXiv:1001.3476v1, 5 pages.

Erez et al., "Capacity and lattice strategies for canceling known interference," IEEE Transactions on Information Theory, vol. 51, No. 11, Nov. 2005, pp. 3820-3833.

İşcan et al., "Sign-Bit Shaping Using Polar Codes," CoRR, submitted on Oct. 29, 2019, arXiv:1910.13240v1, 10 pages.

Erez et al., "A close-to-capacity dirty paper coding scheme," IEEE Transactions on Information Theory, vol. 51, No. 10, Oct. 2005, pp. 3417-3432.

Sun et al., "Near-Capacity Dirty-Paper Code Design: A Source-Channel Coding Approach," IEEE Transactions on Information Theory, vol. 55, No. 7, Jul. 2009, pp. 3013-3031.

International Search Report and Written Opinion in International Appln. No. PCT/EP2021/061739, mailed on Jan. 31, 2022, 16 pages.

* cited by examiner

DEVICES AND METHODS FOR A DIRTY PAPER CODING SCHEME

CROSS-REFERENCE TO RELATED APPLICATIONS

This application is a continuation of International Application No. PCT/EP2021/061739, filed on May 4, 2021, the disclosure of which is hereby incorporated by reference in its entirety.

TECHNICAL FIELD

The present disclosure relates to a coding scheme for a wireless communication system. In particular, the disclosure relates to a dirty paper coding (DPC) scheme. To this end, the disclosure presents an encoding device and a decoding device, respectively, and corresponding encoding and decoding methods. The encoding device and decoding device are configured to implement the DPC proposed in this disclosure.

BACKGROUND

There are many applications that include transmitting a message over a noisy channel in a presence of interference at a receiver, wherein the interference is known in advance at the transmitter of the message. An example is shown in FIG. 1, wherein a base station 101 (in this case the transmitter) of a wireless communication system 100 transmits a desired signal containing the message to a mobile phone 102 (in this case the receiver).

The interference at the receiver is caused by other signals that are simultaneously transmitted on the same time-frequency resources. These signals may originate from the same transmitter 101 as the desired signal or from other sources sending known transmit signals (e.g., from another base station 103). Assuming that channel state information (CSI) is available at the transmitter 101, the interference observed by the receiver 102 can be predicted.

Pre-cancelling the known interference at the transmitter is known as DPC. A general system model thereof is shown in FIG. 2. An encoder 201 of the system 200 (the encoder 201 may be part of the transmitter 101 shown in FIG. 1) maps a message b consisting of K bits onto a transmit signal x consisting of N symbols with an average power constraint P, wherein the interference i is used as side information. A decoder 202 of the system 200 (the decoder 202 may be part of the receiver 102 shown in FIG. 1) forms an estimate $\hat{b}$ of the message based on a noisy receive signal y. Without loss of generality, it may be assumed that n is additive white Gaussian noise (AWGN) with variance $$\sigma_n^2,$$

which is added by the noisy channel to form the receive signal y, and that a signal-to-noise ratio (SNR) is defined as $$SNR = P/\sigma_n^2.$$

The present disclosure is generally concerned with a reliable data transmission over such a noisy channel in the presence of an arbitrary interference that is known at the transmitter, but not at the receiver. That being said, the disclosure is not only related to downlink transmissions in a wireless communication system, but also relates to, e.g., sidelink transmissions on top of other sidelink or uplink signals. Interfering signals may use different waveforms and do in general not have a specific structure, which could aid the receiver in decoding the message. Other potential applications may include crosstalk mitigation in wireline communications or digital watermarking.

SUMMARY

The target of the present disclosure is using a DPC scheme based on probabilistic shaping to improve performance and reduce complexity.

The present disclosure and its embodiments base further on the following considerations.

Coding for channels with known interference has been extensively studied. Theoretical results showed that the rate R=I(d; y)−I(d; i)=H(d|i)−H(d|y) is achievable for discrete memoryless channels using an auxiliary random variable d, where I(x; y) denotes the mutual information between two random variables x and y, and H(x|y) the entropy of x conditioned on y. Based on this, it was found that for AWGN channels, the same channel capacity as for the case without interference is achievable using Gaussian distributed transmit symbols x=d−αi, where $$\alpha = P/(P + \sigma_n^2)$$

corresponds to the minimum mean squared error (MMSE) scaling factor. These theoretical results are based on random coding arguments, and are hence not suitable for practical implementations.

Further, it was proposed to use a simple scalar modulo operation after subtracting the interference from the data symbols according to x=(d−i) mod A, in order to limit the dynamic range and hence the power of the transmit signal. However, the scalar modulo operation causes a severe performance degradation (especially at low SNR), if the data symbols d are uniformly distributed and independent of the interference.

In order to approach the capacity limits of the channel, lattice coding strategies were considered, and the scalar Tomlinson-Harashima precoding (THP) was replaced by x=(d−αi−v)mod Λ, where v corresponds to a uniformly distributed dither signal and x' mod $\Lambda \triangleq x' - Q_\Lambda(x')$ maps the vector x' to the fundamental Voronoi region of the shaping lattice Λ. General device structures for this scheme are shown in FIG. 3 for an encoding device (at the transmitter side) and a decoding device (at the receiver side). Note that $Q_\Lambda(x')$ corresponds to a N-dimensional vector quantization to the closest lattice point, which has high computational complexity in general.

Most previous practical DPC schemes employ trellis-coded quantization (TCQ) for signal shaping. In this case, the Viterbi algorithm can be used to reduce the complexity of the vector quantization at the transmitter side. However, trellis codes with a very large number of states are needed, in order to realize close to optimal shaping gains, which still involves a high computational complexity. Furthermore, very complex iterative decoding devices with soft-output quantization and feedback from the outer channel decoder (indicated by the dashed arrow in FIG. 3) are required to achieve good performance.

To sum up, the above-described solutions have the following disadvantages:

Simple DPC schemes like THP do not perform signal shaping, which leads to suboptimal performance, especially at low SNR.

Other DPC schemes based on geometric shaping using TCQ require advanced iterative receivers with soft-output quantization, which have very high complexity.

In view of the above, embodiments of this disclosure aim to provide an encoding device and a decoding device for implementing an improved DPC scheme. An objective is, in particular, to increase the performance of the DPC, especially at low spectral efficiencies and/or low SNR. Another goal is to enable the use of standard channel codes and decoders. The complexity of the encoding device and the decoding device, respectively, should moreover be as low as possible.

These and other objectives are achieved by the embodiments of this disclosure as described in the enclosed independent claims. Advantageous implementations of the embodiments are further defined in the dependent claims.

The embodiments of this disclosure are based on channel coding and probabilistic shaping that depends on the effective interference, which enables significant performance gains.

A first aspect of this disclosure provides an encoding device, wherein the encoding device is configured to: obtain symbol probabilities for symbols of a symbol sequence given an effective interference based on a target distribution of symbols of a transmit signal; encode a message into the symbol sequence based on the symbol probabilities; and obtain the transmit signal based on a mapping of the symbol sequence and the effective interference using a scalar function.

The encoding device is arranged at the transmitter side. The encoding device may be the transmitter, or may be comprised by a transmitter device. The effective interference is known at the transmitter side. By selecting the symbol probabilities of the symbol sequence based on the target distribution of the transmit signal and the effective interference, the encoding device achieves significant performance gains. In particular, the encoding device may be able to implement DPC with improved performance especially at low spectral efficiencies and/or low SNR. The encoding of the message into the symbol sequence may thereby be performed using standard channel codes, for example, polar codes. The complexity of the encoding device is low, since only a scalar function is used to obtain the transmit signal.

In an implementation form of the first aspect, for encoding the message into the symbol sequence, the encoding device may be configured to determine the symbols of the symbol sequence based on the symbol probabilities such that the symbols of the transmit signal have the target distribution.

In an implementation form of the first aspect, the target distribution of the symbols of the transmit signal may be a truncated Gaussian distribution.

In an implementation form of the first aspect, for encoding the message into the symbol sequence, the encoding device may be configured to select the symbols of the symbol sequence from symbols of a discrete symbol alphabet, wherein the symbols of the discrete symbol alphabet have the symbol probabilities depending on the effective interference.

In an implementation form of the first aspect, for encoding the message into the symbol sequence, the encoding device may be configured to: convert the symbol probabilities of the symbols of the discrete symbol alphabet into log-likelihood ratios; and perform a joint channel coding and probabilistic shaping of the message based on the log-likelihood ratios to obtain the symbol sequence.

According to the above implementation forms, the encoding device is able to perform probabilistic shaping that depends on the effective interference, which leads to significant performance gains.

In an implementation form of the first aspect, the symbols of the discrete symbol alphabet may be provided with a bit labelling, wherein the bit labelling comprises a natural labelling or Gray labelling.

The encoding device may use a symbol alphabet with any sort of bit labelling, e.g., natural or Gray labeling, or a combination thereof.

In an implementation form of the first aspect, for encoding the message into the symbol sequence, the encoding device may be configured to determine the symbols of the symbol sequence based further on the bit labelling of the symbols of the discrete symbol alphabet.

In an implementation form of the first aspect, the effective interference further may include a uniformly distributed dither signal.

The uniform dither signal may be user or service specific. Note that the receiver is aware of the applied dither signal in order to decode the message.

In an implementation form of the first aspect, for encoding the message into the symbol sequence, the encoding device may be configured to: divide the message into a plurality of sub-messages; encode each of the sub-messages into a codeword, wherein a first set of the sub-messages is encoded into a first codeword set and a second set of the sub-messages is encoded, based on the first codeword set and the effective interference, into a second codeword set; and map the codewords of the first codeword set and the second codeword set into corresponding symbols to obtain the symbol sequence.

In an implementation form of the first aspect, the encoding device may be further configured to encode each sub-message in the second codeword set by using a channel decoder.

In an implementation form of the first aspect, the encoding device may be further configured to encode each of the sub-messages into a codeword based on log-likelihood ratios of a set of candidate codewords.

According to the above implementation forms, the encoding device may be used for implementing a multi-level architecture at the transmitter side.

In an implementation form of the first aspect, obtaining the transmit signal based on the mapping of the symbol sequence and the effective interference using the scalar function comprises: obtaining a further symbol sequence based on the symbol sequence and the effective interference; and obtaining the transmit signal by applying the scalar function, which comprises a scalar modulo operation, on the further symbol sequence.

This provides an efficient way of obtaining the transmit signal with performance gains.

In an implementation form of the first aspect, the encoding the message into the symbol sequence comprises polar encoding, and the encoding device may be further configured to notify a receiver a number of shaping bits and/or an allocation of shaping bits.

A second aspect of this disclosure provides a decoding device, the decoding device is configured to: obtain a receive signal; obtain a symbol sequence based on the receive signal and a scaling factor using a scalar function; and decode the symbol sequence to obtain a message.

The decoding device is arranged at the receiver side. The decoding device may be the receiver, or may be comprised by a receiver device. The effective interference is typically not known at the receiver side. However, by using the scaling factor and the scalar function, the decoding device may implement the improved DPC scheme together with the encoding device. The complexity of the decoding device is low, since only a scalar function is used to obtain the symbol sequence, and since a standard decoder can be used to decode the symbol sequence.

In an implementation form of the second aspect, the scaling factor may be a MMSE scaling factor.

In an implementation form of the second aspect, the scalar function may include a uniformly distributed dither signal.

In an implementation form of the second aspect, the decoding the symbol sequence to obtain the message comprises polar decoding, and the decoding device may be further configured to receive, from a transmitter, a number of shaping bits and/or an allocation of shaping bits.

A third aspect of this disclosure provides an encoding method, wherein the encoding method comprises: obtaining symbol probabilities for symbols of a symbol sequence given an effective interference based on a target distribution of symbols of a transmit signal; encoding a message into the symbol sequence based on the symbol probabilities; and obtaining the transmit signal based on a mapping of the symbol sequence and the effective interference using a scalar function.

In an implementation form of the third aspect, for encoding the message into the symbol sequence, the method comprises determining the symbols of the symbol sequence based on the symbol probabilities such that the symbols of the transmit signal have the target distribution.

In an implementation form of the third aspect, the target distribution of the symbols of the transmit signal may be a truncated Gaussian distribution.

In an implementation form of the third aspect, for encoding the message into the symbol sequence, the method may comprise selecting the symbols of the symbol sequence from symbols of a discrete symbol alphabet, wherein the symbols of the discrete symbol alphabet have the symbol probabilities depending on the effective interference.

In an implementation form of the third aspect, for encoding the message into the symbol sequence, the method may comprise: converting the symbol probabilities of the symbols of the discrete symbol alphabet into log-likelihood ratios; and performing a joint channel coding and probability shaping of the message based on the log-likelihood ratios to obtain the symbol sequence.

In an implementation form of the third aspect, the symbols of the discrete symbol alphabet may be provided with a bit labelling, wherein the bit labelling comprises a natural labelling or Gray labelling.

In an implementation form of the third aspect, for encoding the message into the symbol sequence, the method may comprise determining the symbols of the symbol sequence based further on the bit labelling of the symbols of the discrete symbol alphabet.

In an implementation form of the third aspect, the effective interference may further include a uniformly distributed dither signal.

In an implementation form of the third aspect, for encoding the message into the symbol sequence, the method may comprise: dividing the message into a plurality of sub-messages; encoding each of the sub-messages into a codeword, wherein a first set of the sub-messages is encoded into a first codeword set and a second set of the sub-messages is encoded, based on the first codeword set and the effective interference, into a second codeword set; and mapping the codewords of the first codeword set and the second codeword set into corresponding symbols to obtain the symbol sequence.

In an implementation form of the third aspect, the method further comprises encoding each sub-message in the second codeword set by using a channel decoder.

In an implementation form of the third aspect, the method may further comprise encoding each of the sub-messages into a codeword based on log-likelihood ratios of a set of candidate codewords.

In an implementation form of the third aspect, obtaining the transmit signal based on the mapping of the symbol sequence and the effective interference using the scalar function comprises: obtaining a further symbol sequence based on the symbol sequence and the effective interference; and obtaining the transmit signal by applying the scalar function, which comprises a scalar modulo operation, on the further symbol sequence.

In an implementation form of the third aspect, the encoding the message into the symbol sequence may comprise polar encoding, and the method may further comprise notifying a receiver a number of shaping bits and/or an allocation of shaping bits.

The method of the third aspect may be performed by the encoding device of the first aspect. The method of the third aspect and its implementation forms achieve all advantages and effects of the encoding device of the first aspect and its respective implementation forms.

A fourth aspect of this disclosure provides a decoding method, wherein the decoding method comprises: obtaining a receive signal; obtaining a symbol sequence based on the receive signal and a scaling factor using a scalar function; and decoding the symbol sequence to obtain a message.

In an implementation form of the fourth aspect, the scaling factor may be a MMSE scaling factor.

In an implementation form of the fourth aspect, the scalar function may include a uniformly distributed dither signal.

In an implementation form of the fourth aspect, the decoding the symbol sequence to obtain the message may comprise polar decoding, and the method may further comprise receiving, from a transmitter, a number of shaping bits and/or an allocation of shaping bits.

The method of the fourth aspect may be performed by the decoding device of the second aspect. The method of the fourth aspect and its implementation forms achieve all advantages and effects of the decoding device of the second aspect and its respective implementation forms.

A fifth aspect of this disclosure provides a computer program comprising a program code that, when being executed by a processor, causes the processor to perform the method according to the third aspect or the fourth aspect or any implementation form thereof.

A sixth aspect of this disclosure provides a non-transitory storage medium storing executable program code which, when executed by a processor, causes the method according to the third aspect or fourth aspect or any of their implementation forms to be performed.

In summary, the proposed DPC scheme, implemented by the encoding device or encoding method and decoding device and decoding method, respectively, according to the above aspect and implementation forms, has the following advantages compared to other solutions:

Compared to THP, which results in a uniformly distributed transmit signal, significant performance gains can be achieved through probabilistic shaping, especially at low spectral efficiencies and/or SNR.

In contrast to other solutions, channel coding and shaping depending on the effective interference can be performed jointly, which is more efficient.

Standard channel codes (e.g., polar codes) and standard decoders (at the decoding device) may be used.

The proposed DPC scheme is not restricted to linear lattice codes and works for arbitrary bit labeling of the symbols of the discrete alphabet (e.g., natural or Gray labeling, or a combination thereof).

A simple multi-level encoding device structure may be used (at the transmitter side) that successively encodes bit-levels.

Standard multi-level decoders may be used (at the receiver side) to decode the bit-levels at the decoding device.

No additional vector quantizer or shaping decoder is required at the decoding device, so that the complexity is almost the same as without shaping.

Other solutions based on TCQ with iterative receivers typically have much higher complexity.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementation forms will be explained in the following description of specific embodiments in relation to the enclosed drawings, in which.

DETAILED DESCRIPTION OF EMBODIMENTS

In this disclosure, a novel DPC scheme based on probabilistic shaping is proposed. Structures for an encoding device 400 and decoding device 410 for this DPC scheme are depicted in FIG. 4 and FIG. 5, respectively.

Figure 4:
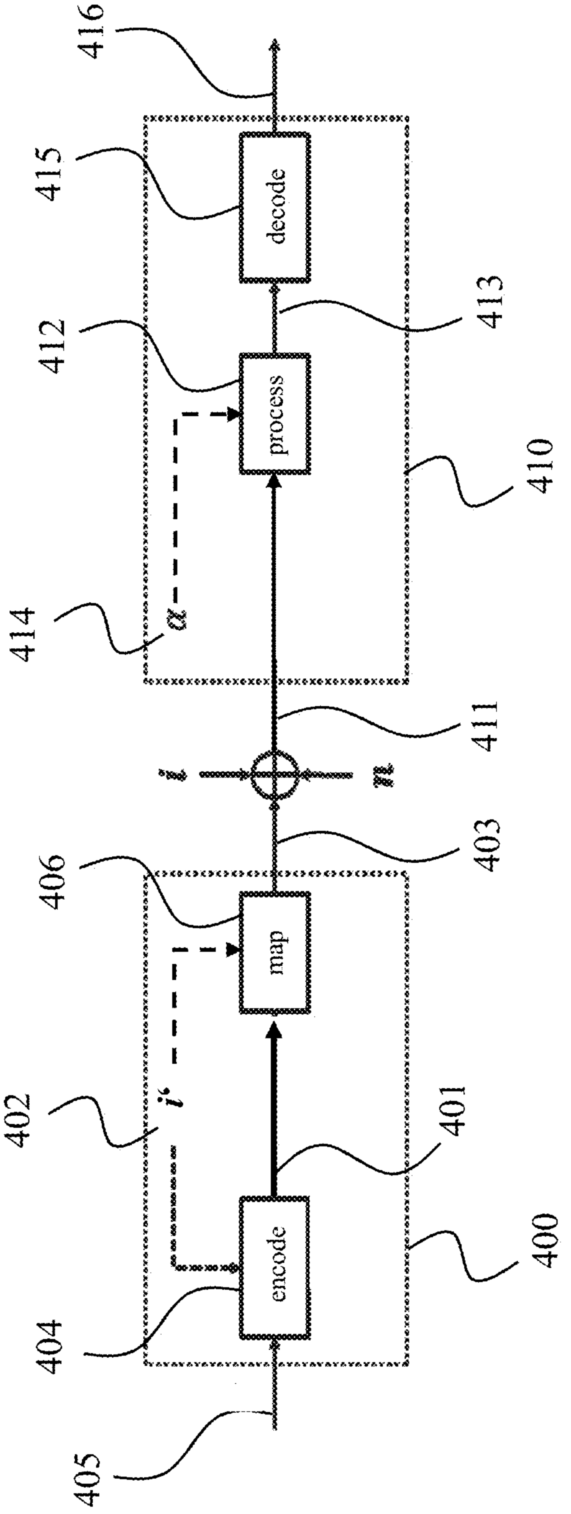
FIG. 4 shows an encoding device and a decoding device, respectively, according to embodiments of the disclosure, for implementing the DPC of this disclosure.
Figure 5:
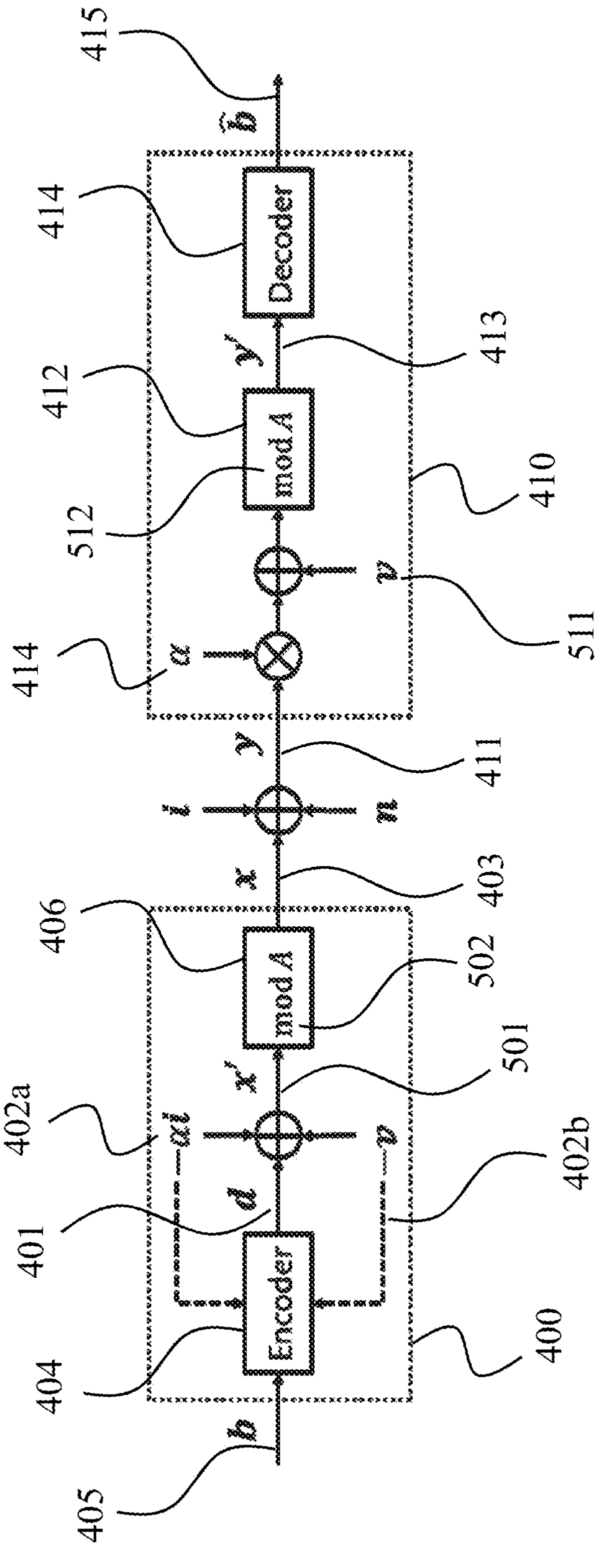
FIG. 5 shows the DPC scheme of this disclosure, implemented based on probabilistic shaping by an encoding device and a decoding device according to embodiments of the disclosure.

FIG. 4 shows an encoding device 400 and a decoding device 410 according to embodiments of the disclosure. The encoding device 400 and the decoding device 410 may form a wireless communication system or may be part of such a system. The encoding device 400 is arranged at the transmitter side, and may be or be part of a transmitter. The decoding device 410 is arranged at the receiver side, and may be or be part of a receiver. The encoding device 400 and the decoding device 410 may communicate over a noisy channel, which adds noise n to a signal sent over the channel. In addition, an interference i may disturb the received signal at the receiver side, i.e., at the decoding device 410. The interference, and/or an effective interference (denoted by i') that is based on the interference at the receiver side, may be known at the transmitter side, i.e., at the encoding device 400.

The encoding device 400 is configured to obtain symbol probabilities for symbols of a symbol sequence 401 given the effective interference 402 based on a target distribution of symbols of a transmit signal 403. In particular, the encoding device is configured to obtain the symbol probabilities in dependence of the effective interference 402 and in order to obtain the transmit signal 403 having the target distribution.

Further, the encoding device 400 is configured to encode 404 a message 405 into the symbol sequence 401 based on the symbol probabilities. The obtaining may be done at an optional computational block 404 of the encoding device 400, which may be an encoder.

Then, the encoding device 400 is configured to obtain the transmit signal 403 based on a mapping of the symbol sequence 401 and the effective interference 402 using a scalar function. This may be done at an optional computational block 406 of the encoding device 400, which may be a modulo operation processor.

The decoding device 410 is configured to obtain a receive signal 411. The receive signal 411 obtained by the decoding device 410 may correspond to the transmit signal 403 sent by the encoding device 400, and may be received by the decoding device 410 after transmission over the noisy channel, and in the presence of the interference i.

The decoding device is further configured to obtain a symbol sequence 413 based on the receive signal 411 and a scaling factor 414 (denoted by a) using a scalar function. In particular, the decoding device 410 is configured to process the receive signal 411 by multiplying it with the scaling factor 414 and applying the scalar function on the result of the multiplication. This may be done at an optional computational block 412 of the encoding device 410, which may be a modulo operation processor.

Further, the decoding device 410 is configured to decode the symbol sequence 413 to obtain a message 416, which is ideally the same as the message 405. This may be done at an optional computational block 415 of the decoding device 410, which may be a decoder.

The encoding device 400 and/or decoding device 410 may comprise a processor or processing circuitry (not shown) configured to perform, conduct or initiate the various operations of the respective device 400, 410 described herein. The processing circuitry may comprise the computational blocks 404 and 406 and/or 412 and 415, respectively.

The processing circuitry may comprise hardware and/or the processing circuitry may be controlled by software. The hardware may comprise analog circuitry and/or digital circuitry. The digital circuitry may comprise components such as application-specific integrated circuits (ASICs), field-programmable arrays (FPGAs), digital signal processors (DSPs), or multi-purpose processors.

The encoding device 400 and/or decoding device 410 may further comprise memory circuitry, which stores one or more instruction(s) that can be executed by the processor or by the processing circuitry, in particular under control of the software. For instance, the memory circuitry may comprise a non-transitory storage medium storing executable software code which, when executed by the processor or the processing circuitry, causes the various operations of the respective device 400, 410 to be performed.

In one embodiment, the processing circuitry comprises one or more processors and a non-transitory memory connected to the one or more processors. The non-transitory memory may carry executable program code which, when executed by the one or more processors, causes the device 400, 410 to perform, conduct or initiate the operations or methods described herein.

FIG. 5 shows an encoding device 400 and a decoding device 410 according to embodiments of the disclosure, which build on the embodiments shown in FIG. 4. Same elements in FIG. 4 and FIG. 5 are labelled with the same reference signs and may be implemented likewise.

The encoding device 400 and the decoding device 410 of FIG. 5 are more detailed versions of the same devices 400, 410 shown in FIG. 4. The encoding device 400 comprises an encoder (as the computational block 404) and a modulo operation processor configured to perform a scalar modulo operation 502 (as the computational block 406). The decoding device 410 comprises a modulo operation processor configured to perform a scalar modulo operation 512 (as the computational block 412) and a decoder (as the computational block 414). The two scalar modulo operations may notably be the same operations, or may be different operations.

The encoder 404 of the encoding device 400 maps the message 405 (denoted by b) onto symbols of the symbol sequence 401 (denoted by d) depending on the effective interference, which is in this example of FIG. 5 defined by i'=(αi+v) mod A. This mapping is done such that the symbols of the transmit signal 403 (denoted by x) have or approximate the target probability distribution $p_t(x)$.

In particular, the mapping of the symbol sequence 401 and the effective interference 402, in order to obtain the transmit signal 403, comprises in this example the obtaining of a further symbol sequence 501 (denoted by x') based on the symbol sequence 401 and the effective interference 402, and then the obtaining of the transmit signal 403 by applying the scalar modulo operation 502 on the further symbol sequence 501.

Figure 1:
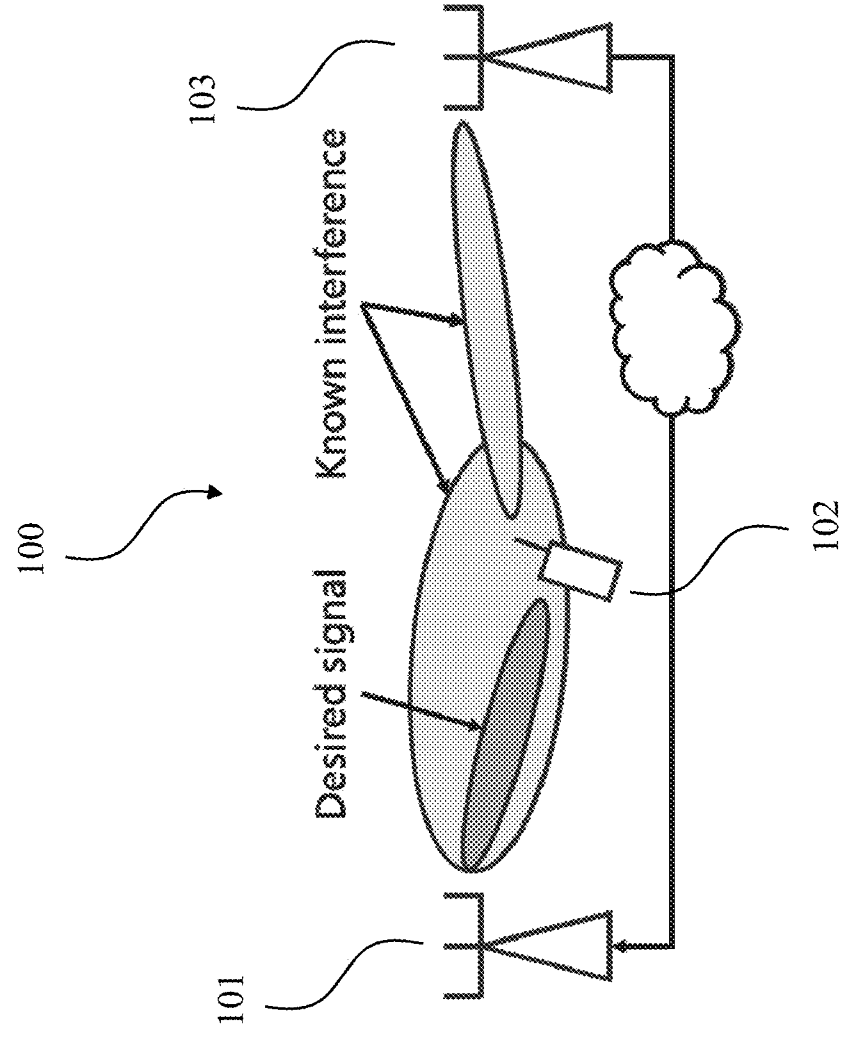
FIG. 1 shows an example of a downlink transmission with known interference in a wireless communication system.
Figure 2:
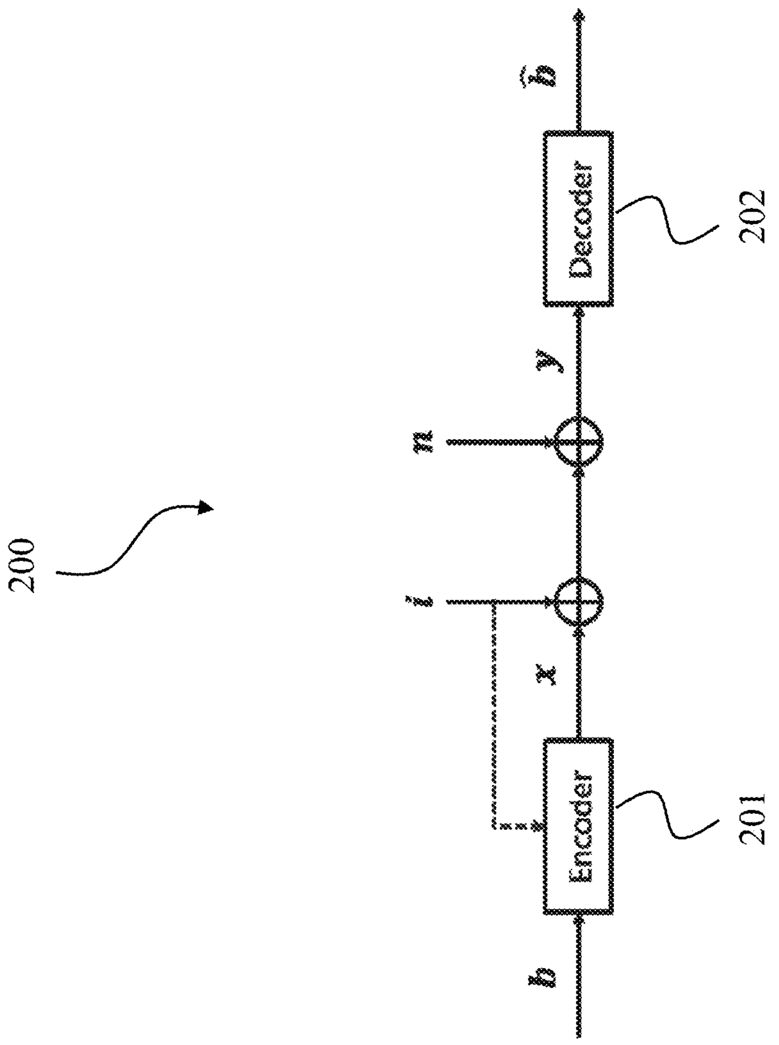
FIG. 2 shows a general system model for an exemplary DPC scheme.
Figure 3:
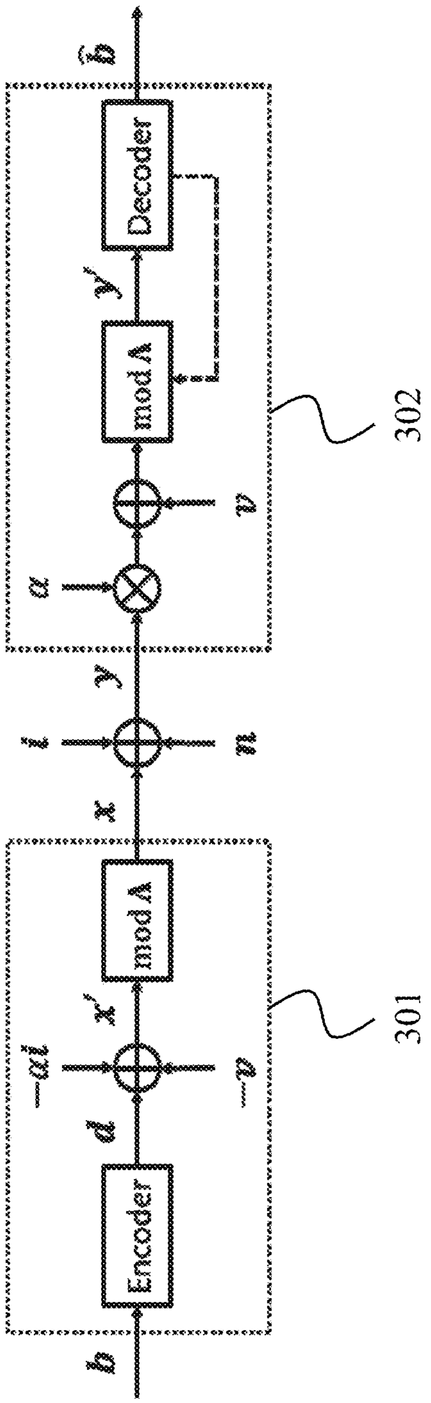
FIG. 3 shows an exemplary DPC scheme based on geometric shaping using a shaping lattice.

The encoder 404 may perform joint channel coding and probabilistic shaping, wherein the target distribution of the symbols of the symbol sequence d depends on the interference i and the optional dither signal v, i.e., it depends on the effective interference i'. Instead of the lattice modulo operation shown in FIG. 3, which involves a vector quantization, a simple scalar modulo operation 502—for example, x' mod $A \triangleq x' - Q_A(x')$—may be applied to the elements of the further symbol sequence 501. This allows using standard algorithms for channels without interference at the decoder 414 of the decoding device 410 with only minor modifications.

At the decoding device 410, the receive signal 411 (denoted by y) is received after the noisy channel. Then the symbol sequence 413 (denoted by y', also referred to as effective receive signal) is obtained based on the receive signal 411 and the scaling factor 414 (denoted by α) using the scalar function, which comprises the scalar modular operation 512.

The scalar modulo operation 512 at the receiver side may be the same as the scalar modulo operation 502 on the transmitter side. The scalar function 412 includes a multiplication of the receive signal 411 with the scaling factor 414, and the scalar function may further include a uniformly distributed dither signal 511 (denoted by v), which may be added.

Then, the decoding device 410 is further configured to decode 415 the symbol sequence 413 (i.e., the effective receive signal y') with the decoder 414 to obtain the decoded message 415 (denoted by $\hat{b}$).

For ease of exposition, real-valued signals are considered in the following. The extension to complex-valued equivalent baseband signals is straightforward by using two real-valued symbols as real and imaginary parts of one complex-valued symbol.

In a first step, the distribution of an arbitrary symbol d of the symbol sequence d conditioned on the interference i and the optional uniform dither signal v may be determined, where i and v are the elements of the sequences i and v corresponding to the symbol d (and likewise for other sequences considered in the following). The effective interference i'=(αi+v) mod A is uniformly distributed within the modulo interval of size A. Hence, the distribution of the transmit signal x=(d−i')mod A is given by $$p(x)=\sum_{d\in\mathcal{A}} p(d,\ i'=(d-x)\bmod A),$$

where $\mathcal{A}$ denotes a discrete symbol alphabet, from which the symbols d of the symbol sequence d are selected. Due to the uniform distribution of the effective interference, the joint distribution of d and is $$p(d,\ i')=p(d|i')\cdot p(i')\propto p(d|i').$$

Hence, the distribution of d given i' should be $$p(d|i')\propto p_t(x=(d-i')\bmod A).$$

Figure 6:
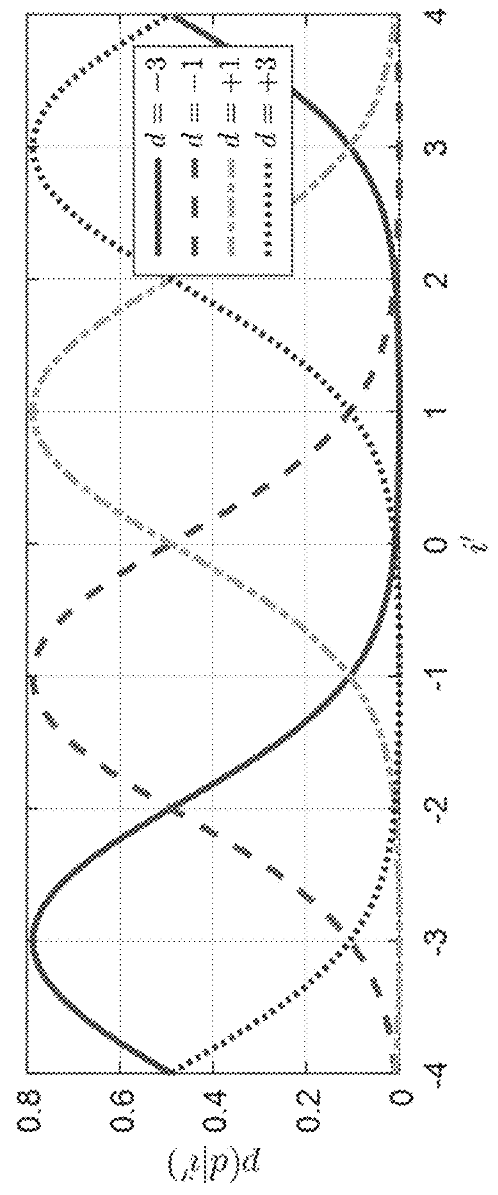
FIG. 6 shows a conditional symbol distribution for truncated Gaussian target distribution.

An example of the above conditional distributions is shown in FIG. 6 for the truncated Gaussian distribution $$p_t(x)\propto \exp\left(-\frac{x^2}{2\sigma^2}\right)$$

with $x \in [-A/2, A/2]$, wherein [ . . . ] denotes a closed interval, i.e., x is equal to or larger than −A/2 and equal to or smaller than +A/2. The variance before truncation is chosen as $\sigma^2=1$, the modulo interval has size A=8, and the symbols are taken from a 4-ASK alphabet, wherein the symbol $d \in \{-3, -1, +1, +3\}$, wherein { . . . } denotes a set, i.e., d is −3, −1, +1, or +3. From this example, it is obvious that the target symbol probabilities depend on the effective interference i'. As a consequence, it is not possible to use shaping algorithms that require the symbols in d to have predefined distributions.

In a second step, the symbol probabilities may be converted into bit-level log-likelihood ratios (LLRs). This enables the use of binary channel codes for joint channel coding and shaping. Note that this step is not required for embodiments that use non-binary codes. Assume that m bits $c_1 \ldots c_m$ are mapped to a symbol d of the symbols sequence d such that $$p(d \mid i') = \prod_{l=1}^{m} p(c_l \mid c_1 \ldots c_{l-1}, i').$$

The conditional probabilities $p(c_l|c_1 \ldots c_{l-1}, i')$ may be obtained through marginalization. The bit-level LLRs are then given by $$L(c_l \mid c_1 \ldots c_{l-1}, i') = \log \frac{p(c_l = 0 \mid c_1 \ldots c_{l-1}, i')}{p(c_l = 1 \mid c_1 \ldots c_{l-1}, i')}.$$

Figure 7:
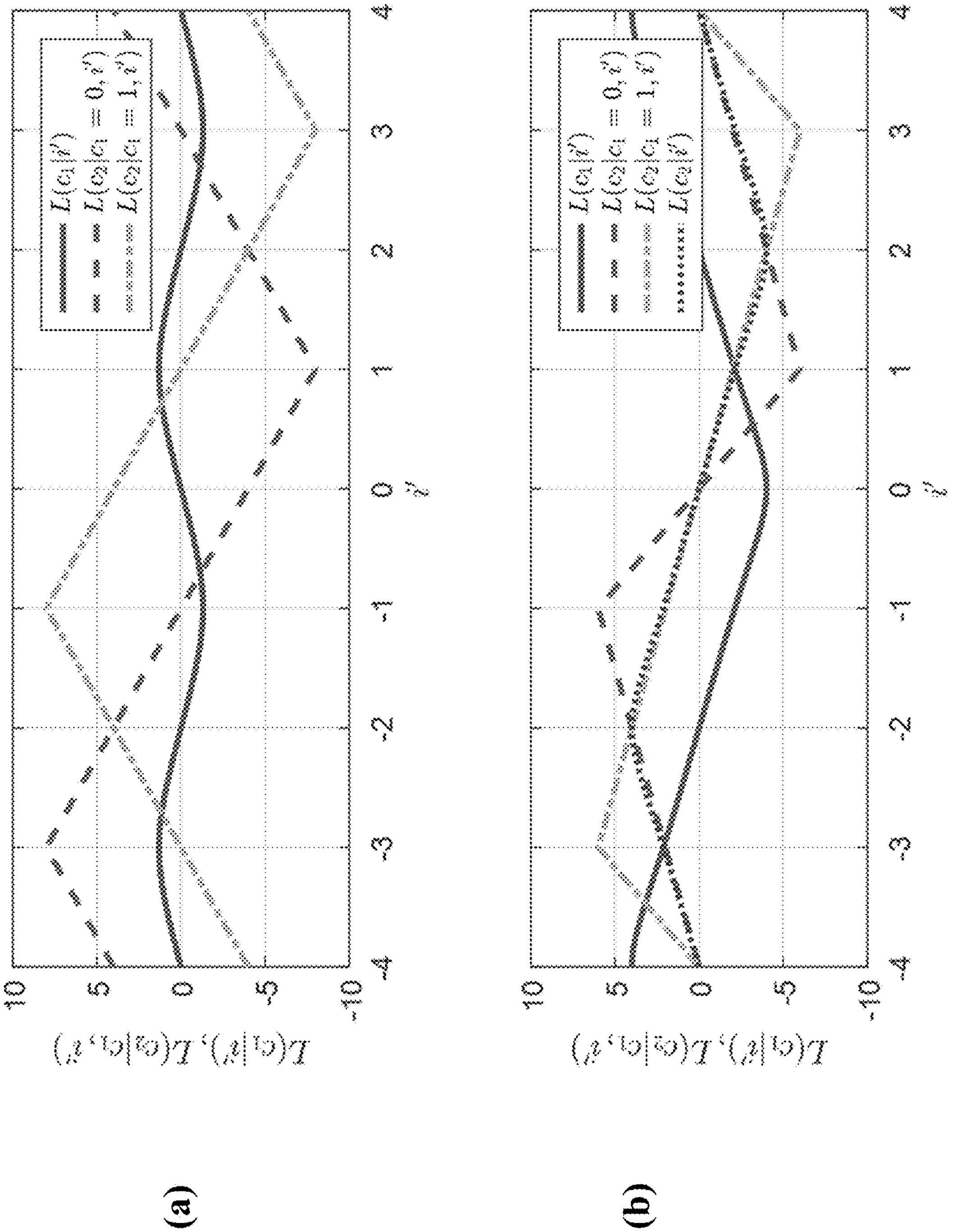
FIG. 7 shows bit-level LLRs for the example distribution shown in FIG. 6, exemplarily for natural labeling (a) and Gray labeling (b), respectively.

An example of the bit-level LLRs for the conditional 4-ASK symbol distributions from FIG. 6 is shown in FIG. 7. Note that the results depend on the applied bit labeling of the symbols $d \in \{-3, -1, +1, +3\}$. For natural labeling (see FIG. 7*a*), the curves for $L(c_2|c_1, i')$ are circularly shifted depending on the value of $c_1$. This is different for Gray labeling (see FIG. 7*b*), where we also plot the curve for $L(c_2|i')$ without conditioning on $c_1$, which may be used by certain embodiments to approximate the distribution $p(d|i')$. Generally, the symbols of the discrete symbol alphabet may be provided with any bit labelling, wherein the bit labelling may, for example, be a natural labelling or Gray labelling.

Figure 8:
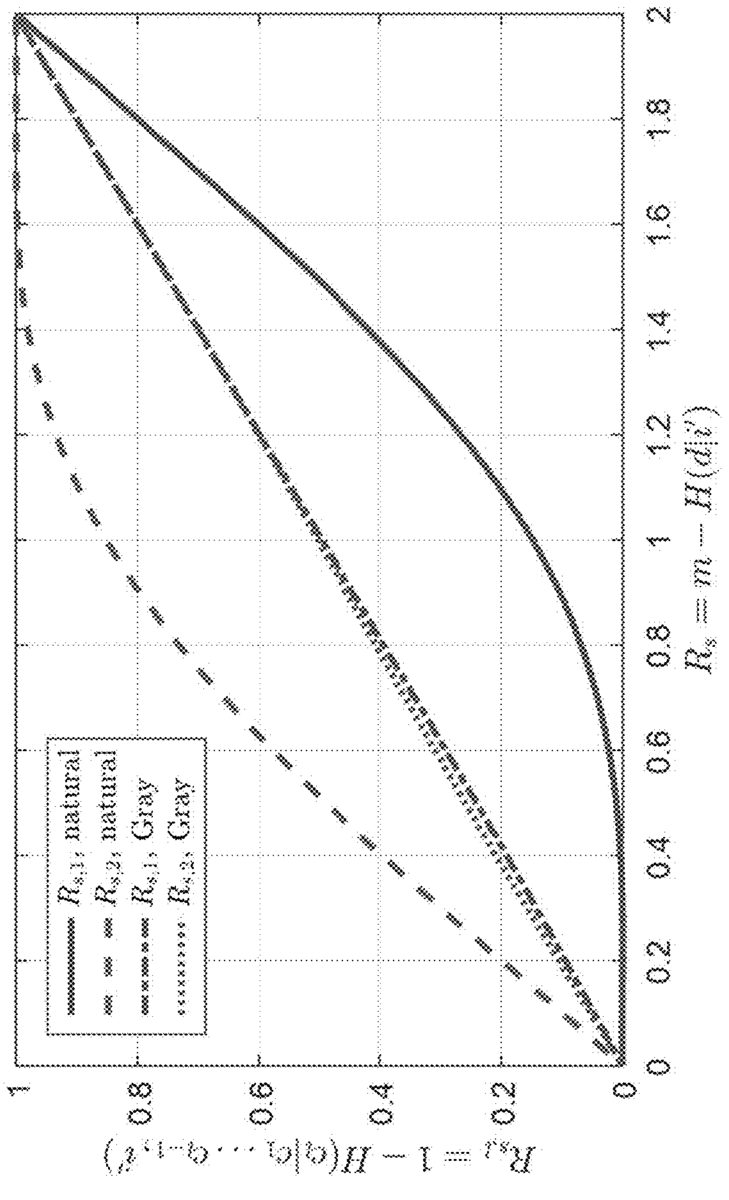
FIG. 8 shows shaping rates per bit-level vs. a total shaping redundancy per symbol.

In a third step, the shaping rates per bit-level may be determined for a target symbol distribution. FIG. 8 shows the asymptotically optimal shaping rates $R_{s,l}=1-H(c_l|c_1 \ldots c_{l-1}, i')$ vs. the total shaping redundancy per symbol $R_s=m-H(d|i')$, which is obtained by varying the parameter $\sigma^2$ of the truncated Gaussian distribution. In practice, the shaping rates may be further optimized taking finite block lengths and implementation specific losses into account.

Figure 9:
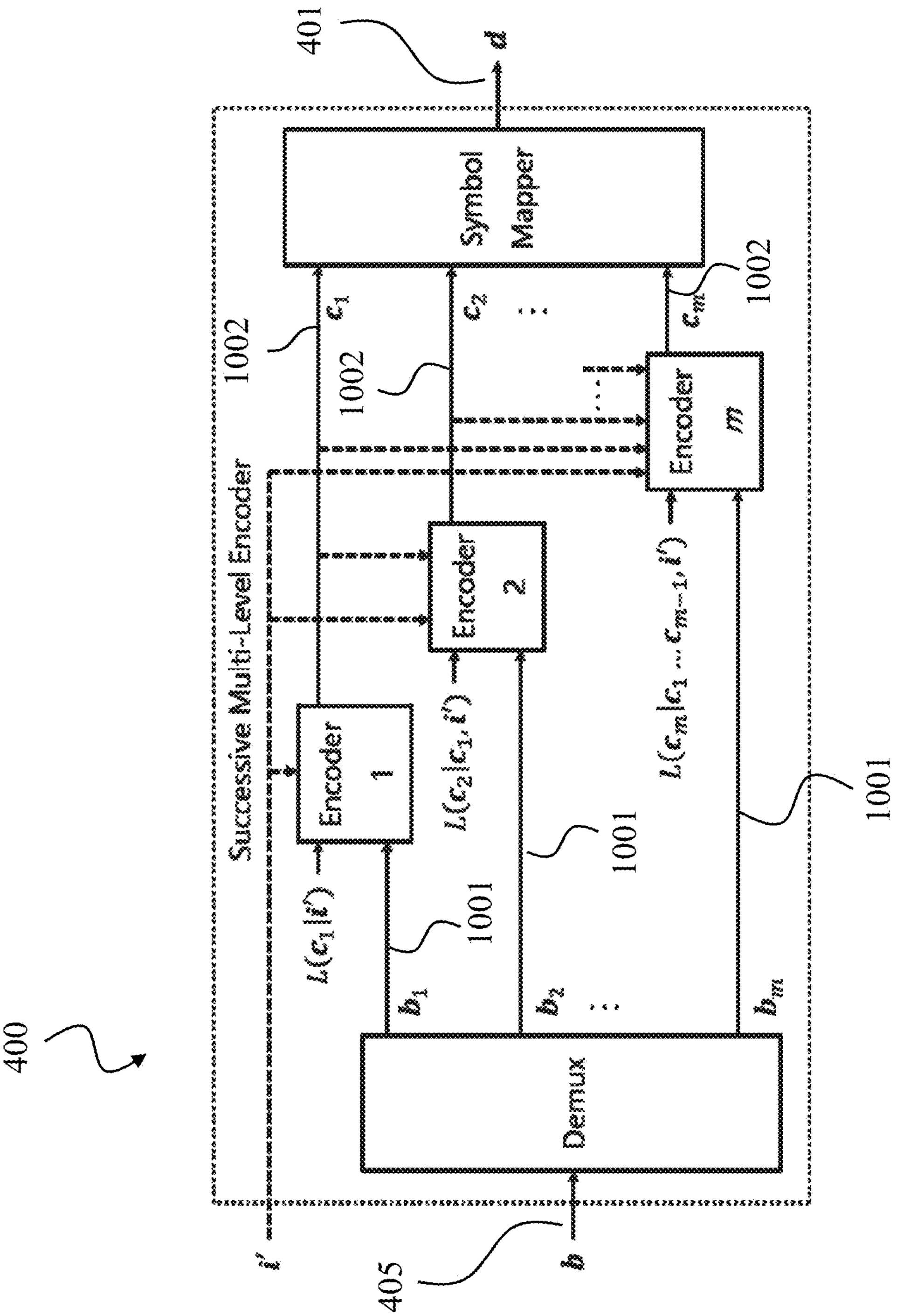
FIG. 9 shows a successive multi-level encoder (at an encoding device according to an embodiment of the disclosure) for the DPC scheme of this disclosure as shown in FIG. 5.

After these preliminaries, an encoding device 400 based on the proposed DPC scheme from FIG. 5 may be described in detail. In particular, a possible implementation of the encoding device 400 based on a multi-level architecture is shown in FIG. 9.

The message b may be first demultiplexed into m sub-messages $b_1 \ldots b_m$. Let there be $2^{N \cdot R_{s,l}}$ candidate codewords representing the same message $b_l$ in each level. Encoder l may then aim to select the most likely codeword $c_l$ given the input LLRs $$L(c_l \mid c_1 \ldots c_{l-1}, i') = [L(c_{l,1} \mid c_{1,1} \ldots c_{l-1,1}, i'_1) \ldots L(c_{l,N} \mid c_{i,N} \ldots c_{l-1,N}, i'_N)]$$

from the set of candidate codewords.

Figure 10:
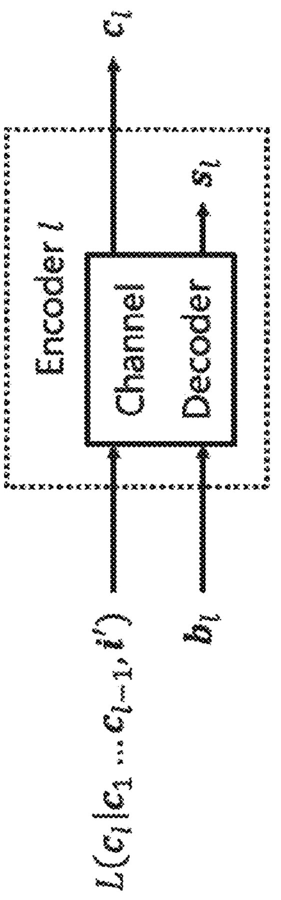
FIG. 10 shows an encoder based on a channel decoder, as it may be used at an encoding device according to an embodiment of the disclosure.

In fact, this corresponds to a channel decoding problem. For linear codes, the codeword may be written as $c_l=[b_l\ s_l]\cdot G_l$, where $G_l$ is the generator matrix and $s_l$ is a vector containing $N \cdot R_{s,l}$ shaping bits. In contrast to a standard channel decoder, the message bits $b_l$ are fixed and the search is only performed over the shaping bits $s_l$. Thus, the encoder 404 of the encoding device 400 may be implemented using standard channel decoders, which is illustrated in FIG. 10. In particular, the encoding device 400 may be configured to encode each sub-message 1001 in the second codeword set by using the channel decoder.

At the decoding device 410, a conventional multi-level decoder may be used. The codeword estimates $\hat{c}_1 \ldots \hat{c}_m$ may be determined successively based on the LLRs $L(c_l|\hat{c}_1 \ldots \hat{c}_{l-1}, y')$ at the output of the symbol demapper, which are defined similar to $L(c_l|c_1 \ldots c_{l-1}, i')$ with $p(d|i')$ being replaced by $p(d|y') \propto p(y'|d) \cdot p(d)$. If the effective noise n' at the input of the encoding device modulo operation has a Gaussian distribution with zero mean and variance $$\sigma_{n'}^2,$$

the following is obtained:

$$p(y' \mid d) \propto \sum_{k \in \mathbb{Z}} \exp\left(\frac{(y' - d - kA)^2}{2\sigma_{n'}^2}\right).$$

For practical implementations, it is sufficient to consider, e.g., only $k \in \{-1, 0, +1\}$ due to the fast decay of the exponential function. After decoding, the shaping bits may simply be discarded.

The proposed embodiments allow to approach the capacity limits of an AWGN channel in presence of interference known at the encoding device 400 (transmitter). In the following, some simulation results are provided that illustrate the gains of the proposed probabilistic shaping for DPC.

Figure 11:
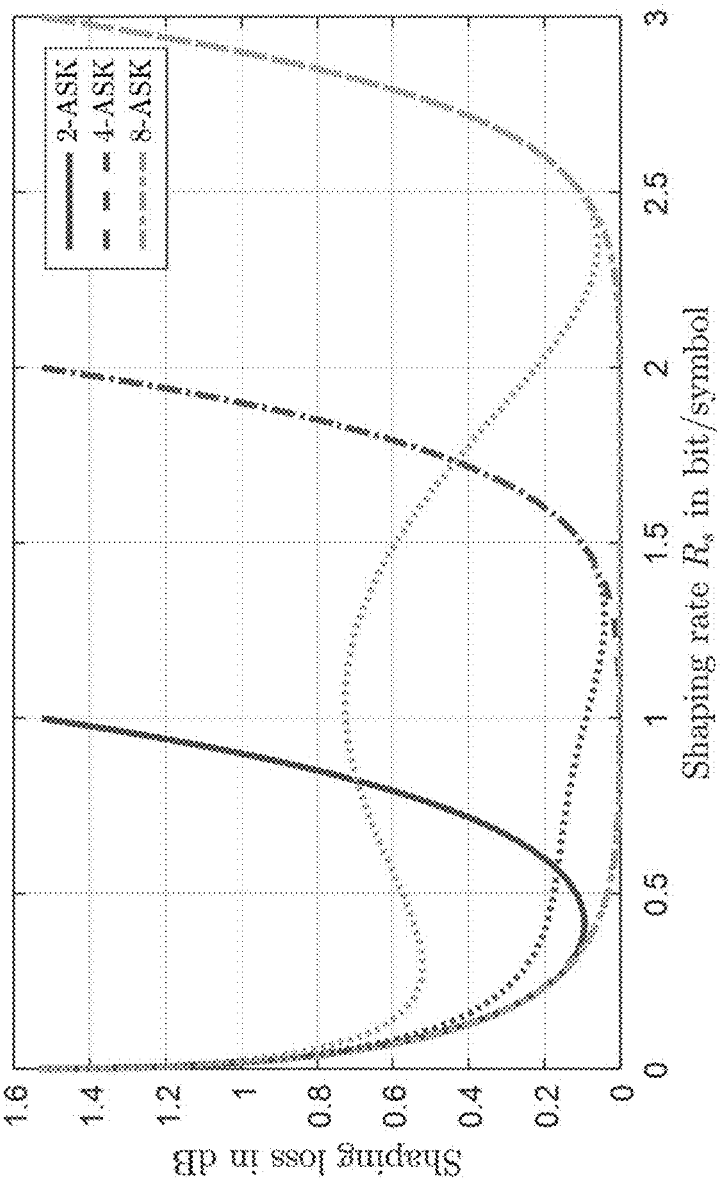
FIG. 11 shows an asymptotic shaping loss, wherein the dotted curves correspond to independent shaping of Gray labeled bit-levels.

FIG. 11 shows the shaping loss (i.e., the power increase compared to an ideal Gaussian distribution with the same entropy as the transmit signal) for different ASK symbol alphabets. For 2-ASK, the minimum shaping loss is approximately 0.1 dB, whereas for larger symbol alphabets the minimum shaping loss is close to 0 dB. Independent shaping of bit-levels using $L(c_l|i')$ without conditioning on other bit-levels leads to some performance degradation. Without shaping, the transmit signal becomes uniformly distributed within the modulo interval, and the corresponding shaping loss amounts to 1.53 dB.

Figure 12:
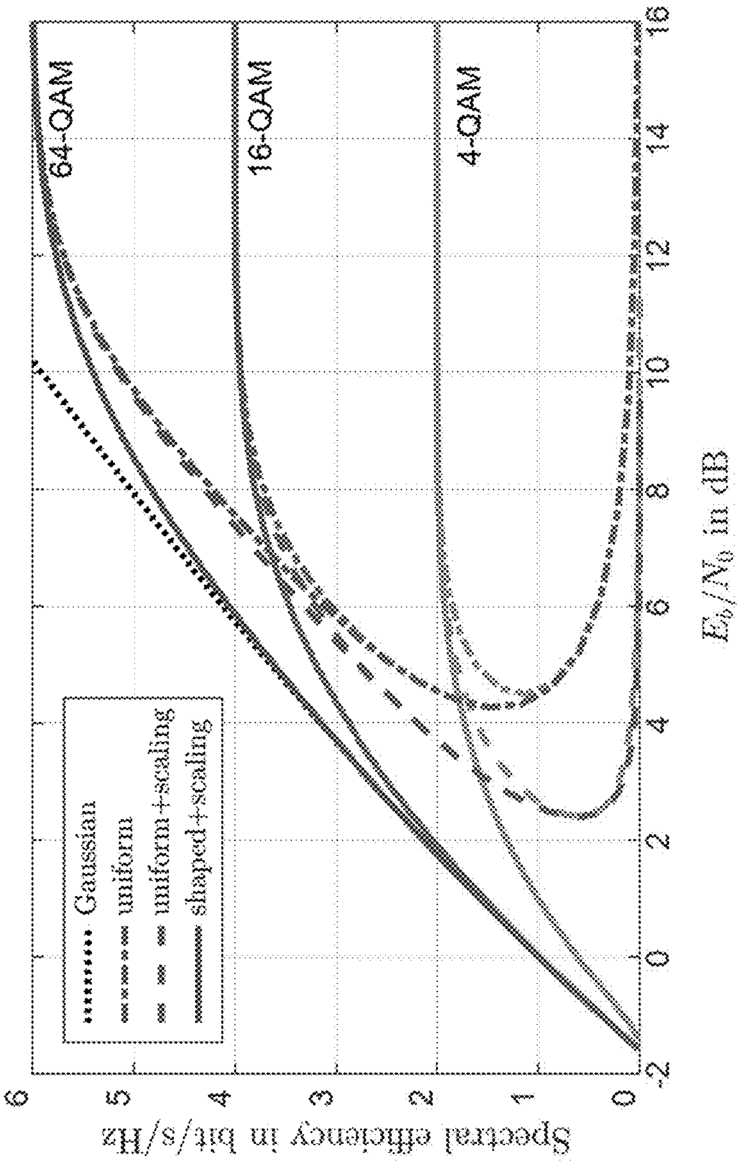
FIG. 12 shows achievable rates for the DPC scheme proposed by this disclosure with and without shaping.

FIG. 12 analyzes how probabilistic shaping and the effective interference scaling factor $\alpha$ affect the achievable rate $R=H(d|i')-H(d|y')$. Note that we consider complex-valued M-QAM constellations here, which correspond to two $\sqrt{M}$-ASK symbols in the real and imaginary part, respectively, and the energy per bit is defined as $E_b/N_0=SNR/R$.

In contrast to interference-free AWGN channels, uniform transmission as in THP causes a large performance degradation for dirty paper coding at low spectral efficiencies.

Optimized scaling provides noticeable gains in this regime, but the minimum $E_b/N_0$ of 2.4 dB is still far away from the capacity limits. With the proposed probabilistic shaping scheme, the same performance as for AWGN channels without interference may be achieved. However, 4-QAM becomes suboptimal even at very low SNR, so higher order modulation should be used.

Figure 13:
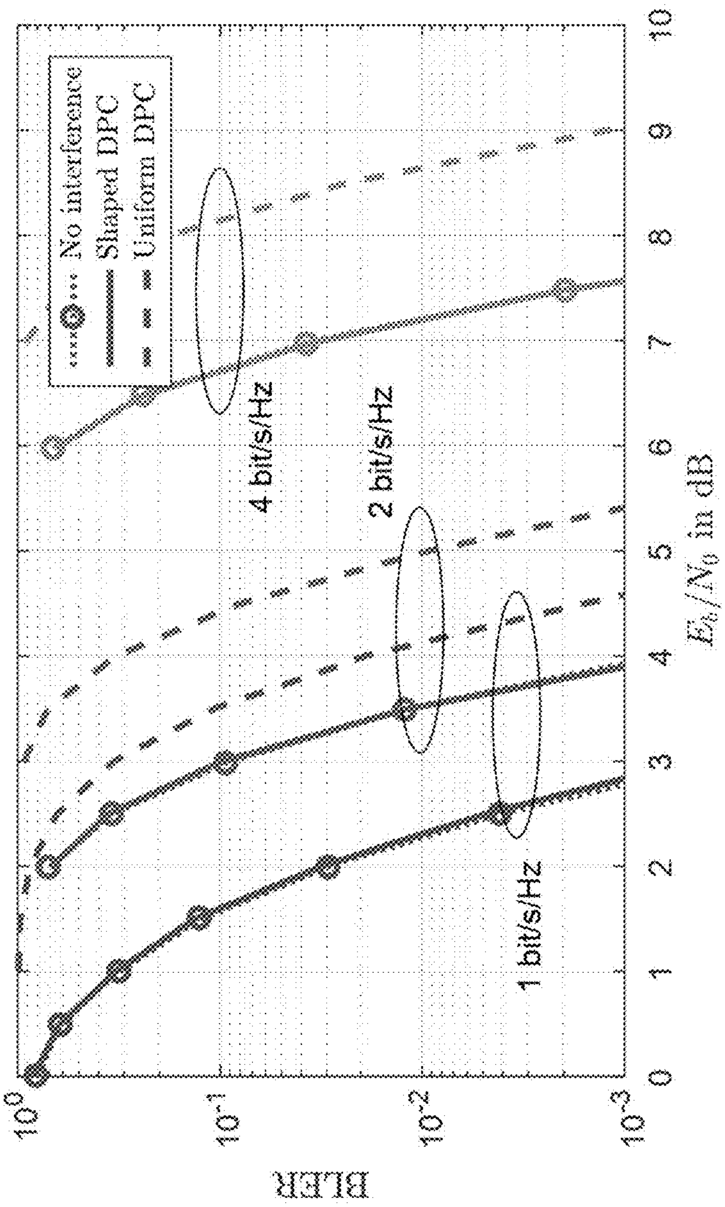
FIG. 13 shows block error rates for the DPC scheme proposed by this disclosure with polar codes.

FIG. 13 shows the block error rate (BLER) simulation results using polar codes for a block length of N=256 symbols, where a multi-level encoder according to FIG. 9 is used at the encoding device 400. More implementation details are provided below.

As predicted by the theoretical results in FIG. 12, the proposed DPC scheme based on probabilistic shaping provides up to 2 dB gain compared to THP with uniform transmit symbols, and achieves the same performance as probabilistic shaping for AWGN channels without interference. At low SNR, the spectral efficiency can be more than doubled for a given target BLER.

An exemplary embodiment used for the simulation results in FIG. 13 is based on the multi-level encoder structure shown in FIG. 9. In each bit-level, a polar code is used in this example for joint shaping and channel coding, and the symbol mapper uses a natural bit labeling.

First, the parameter $\sigma^2$ of the truncated Gaussian target distribution $p_t(x)$ and the corresponding shaping rate $R_s$ are optimized based on the achievable rates. Then, the shaping rates per bit-level $R_{s,l}$ are determined, where the number of shaping bits for a given block length N may be further refined offline through numerical simulations. The shaping bits $s_l$ are allocated to the most reliable polar subchannels and the least reliable ones are frozen to zero. The remaining subchannels carry the message bits $b_l$, which may include additional cyclic redundancy check (CRC) bits for error detection. Note that the receiver needs to know the allocation of shaping, frozen, and message bits to the polar subchannels in order to decode the message.

The encoding device 400 FIG. 9 uses a successive cancellation list (SCL) decoder to determine the shaping bits $s_l$ and the corresponding codeword $c_l$ treating $b_l$ as frozen bits. In order to further improve the performance, the list of candidate codewords $$\{c_l^1 \ldots c_l^L\}$$

with the associated decoding LLRs and path metrics are passed to subsequent bit-levels, where they are used to initialize the SCL decoders. In the last stage, the codewords with the best accumulated path metric are selected. A similar list-passing multi-level decoder is employed at the receiver, where the best candidate fulfilling the CRC is selected.

There are many possible variations and extensions of this multi-level embodiment, e.g.:

The polar codes may be designed in different ways. For example, the polar subchannels used for the message and shaping bits may be chosen to further optimize the performance for a certain decoder implementation, or to reduce the complexity or latency of the decoder. It is also possible to define a universal sequence from which the polar subchannels to be used are selected.

Different techniques like, e.g., puncturing, shortening, or other polarization kernels may be used for rate matching to obtain polar codes for block lengths N that are not a power of two.

Other channel codes or decoding algorithms may be used.

Additional operations like, e.g., interleaving or scrambling may be applied.

Other bit labeling (e.g., Gray labeling) may be used for the symbols.

Figure 14:
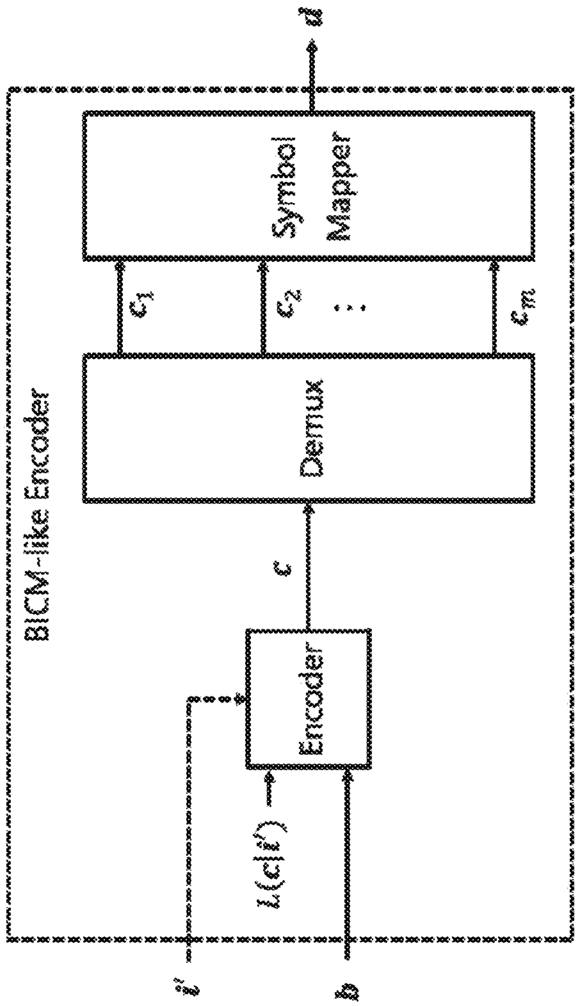
FIG. 14 shows a BICM-like encoder for the DPC scheme of this disclosure shown in FIG. 5.

For Gray labeling the conditioning on previous bit-levels may be neglected, which enables a parallel encoding of bit-levels with reduced latency for the embodiment in FIG. 9. Another embodiment shown in FIG. 14 uses a single encoder for a code of length mN before the demultiplexer, which is also known as bit-interleaved coded modulation (BICM).

For linear codes, the codewords may be written as $$c_l = [b_l s_l] \cdot G_l = b_l G_l' + s_l G_l''.$$

where $$G_l'$$

and $$G_l''$$

are submatrices of the generator matrix $G_l$. Hence, the encoding device 400 in FIG. 9 may be implemented by first calculating $$c_l' = b_l G_l'$$

and then choosing $$c_l'' = s_l G_l''$$

by a channel decoder with the input LLRs $(1-2c'_l)\cdot L(c_l|c_1 \ldots c_{l-1}, i')$. Other embodiments may use non-linear or non-binary codes.

The scaling factor $\alpha$ may be chosen according to the MMSE criterion. In some embodiments, it may be quantized to discrete values. It is also possible to use different scaling factors at the encoding device 400 and the decoding device 410, e.g., $\alpha=1$ at the encoding device 400 and a channel dependent $\alpha$ at the decoding device 410.

The uniform dither signal v is optional and may be omitted in some embodiments. In other embodiments, it may be user or service specific. Note that the receiver needs to be aware of the applied dither signal in order to decode the message.

The modulo interval A is typically chosen depending on the symbol alphabet. For example, for regular M-ASK constellations $\mathcal{A}=\{\pm 1, \pm 3, \ldots, \pm M-1\}$, it may be set to A=2M. Other choices are also possible. Note that the modulo operation x=x' mod A in FIG. 4 is equivalent to transmitting x=d'−i' with $d'=d-Q_A(x')$. Hence, it may be omitted in some embodiments where the dynamic range of the effective interference is limited such that $Q_A(x')=0$.

The embodiments of the disclosure affect the channel coding, symbol mapping, and precoding at a transmitter, which may be or comprise the encoding device 400. In order to decode the message b, a receiver, which may be or comprise the decoding device 410, should know how it was mapped onto the transmit signal x. This includes the following information:

The number and allocation of shaping bits $s_l$.

The scaling coefficient $\alpha$ applied at the transmitter.

The applied common dither signal v.

The modulo interval A.

These parameters, except the dither signal v whose value is independent of the channel SNR, do not need to be signaled independently, but may be specified together with other common modulation and coding parameters in a table. Depending upon the estimated channel quality, a constellation order can be selected for transmission and a fixed shaping rate can be assigned to each QAM order.

Moreover, a sequence for the positions of the shaping bits can be predefined similar to the reliability sequence of the polar codes. Hence, the receiver can determine the number and positions of the shaping bits from the modulation order and shaping sequence. Furthermore, the scaling coefficient a is channel quality dependent and the SNR value needs to be signaled to the transmitter for proper encoding. The modulo interval A can also be specified for each modulation order as emphasized previously. Depending on a particular application the parameters may be either fixed, dynamically adapted based on the estimated channel quality, or chosen in a semi-persistent manner.

In 4G LTE and 5G NR, the PDCCH (physical downlink control channel) and PDSCH (physical downlink shared channel) are specified. The PDCCH uses fixed QPSK modulation. A novel PDCCH can be specified, e.g., to use the proposed DPC scheme with 16-QAM and fixed shaping rate. For the PDSCH, the MCS (modulation coding scheme) may be explicitly signaled through e.g. DCI (downlink control information), or radio resource control (RRC) or media access control (MAC) layer signaling. It may also be that part of MCS parameters are signaled by DCI and another part of MCS parameters are configured by RRC. This can be readily extended to the proposed DPC scheme. For autonomous sidelink transmissions with DPC, the extended MCS parameters may be chosen in a semi-persistent manner.

The transmitter send the DPC scheme related parameters to the receiver may be implemented independently, i.e. it may not necessary depend on any of the previous encoding or decoding operations, but just rely on parameters of the DPC scheme give above which need to be transmitted to the receiver.

Figure 15:
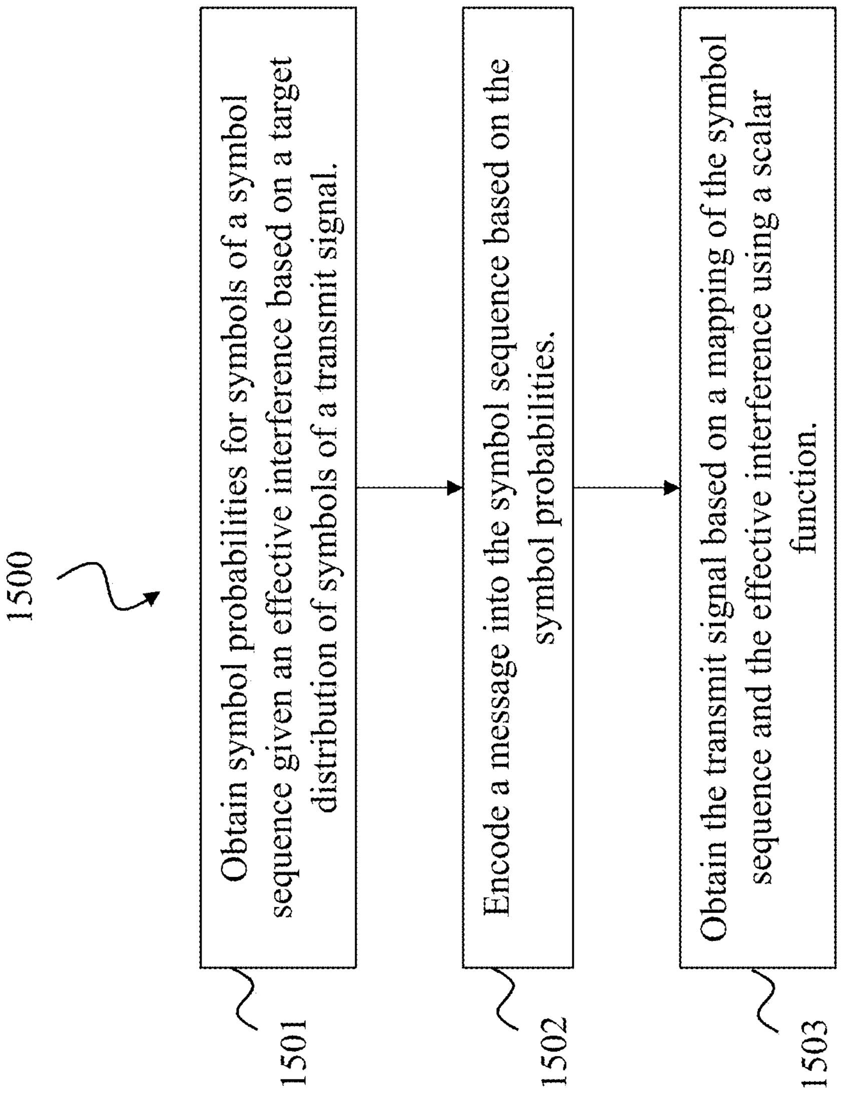
FIG. 15 shows an encoding method according to an embodiment of the disclosure.

FIG. 15 shows an encoding method 1500 according to an embodiment of the disclosure. The encoding method 1500 may be performed by the encoding device 400.

The method 1500 comprises a step 1501 of obtaining symbol probabilities for symbols of a symbol sequence 401 given an effective interference 402 based on a target distribution of symbols of a transmit signal 403. Further, the method 1500 comprises a step 1502 of encoding a message 405 into the symbol sequence 401 based on the symbol probabilities. Then, the method 1500 also comprises a step 1503 of obtaining the transmit signal 403 based on a mapping of the symbol sequence 401 and the effective interference 402 using a scalar function.

Figure 16:
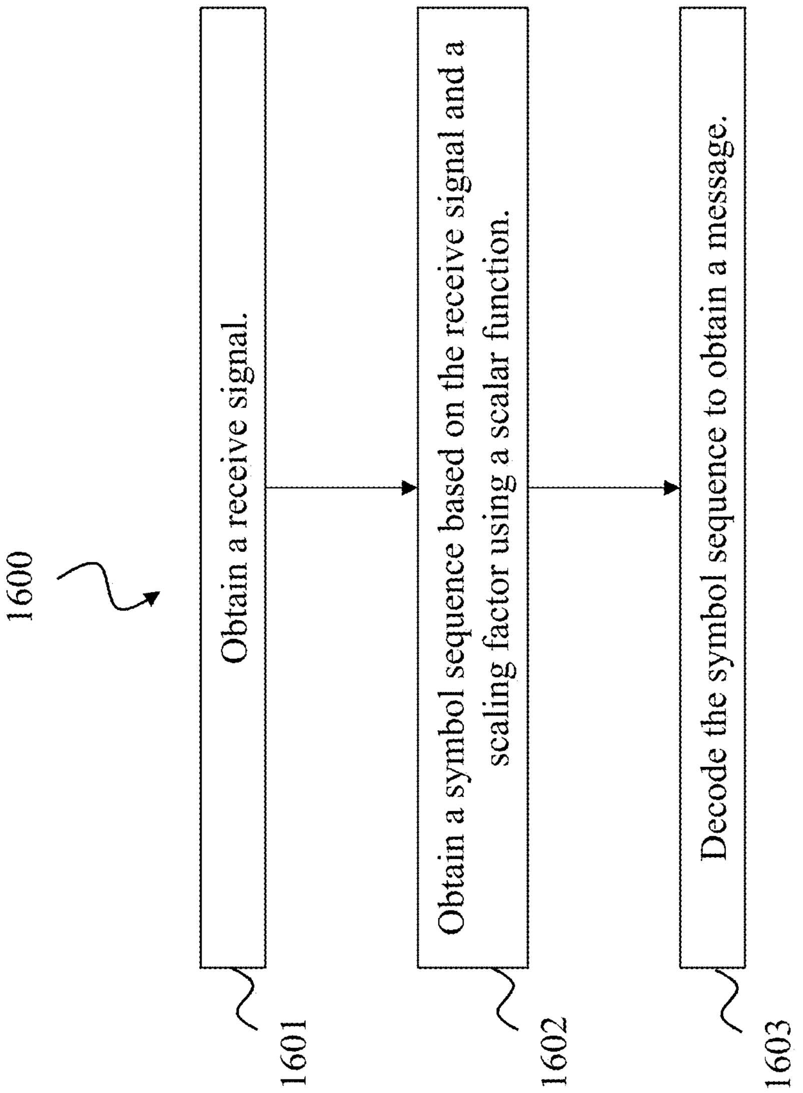
FIG. 16 shows a decoding method according to an embodiment of the disclosure.

FIG. 16 shows a decoding method 1600 according to an embodiment of the disclosure. The decoding method 1600 may be performed by the decoding device 410.

The decoding method 1600 comprises a step 1601 of obtaining a receive signal 411. Further, the method 1600 comprises a step 1602 of obtaining a symbol sequence 413 based on the receive signal 411 and a scaling factor 414 using a scalar function. Then, the method 1600 also comprises a step 1603 of decoding the symbol sequence 413 to obtain a message 416.

The present disclosure has been described in conjunction with various embodiments as examples as well as implementations. However, other variations can be understood and effected by those persons skilled in the art and practicing the claimed matter, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

The invention claimed is:

1. An encoding device, wherein the encoding device is configured to:

obtain, in a dirty paper coding (DPC) scheme, symbol probabilities for symbols of a symbol sequence given an effective interference based on a target distribution of symbols of a transmit signal;

encode, in the DPC scheme, a message into the symbol sequence based on the symbol probabilities; and obtain, in the DPC scheme, the transmit signal based on a mapping of the symbol sequence and the effective interference using a scalar function, wherein the scalar function comprises a scalar modulo operation.

2. The encoding device according to claim 1, wherein for encoding the message into the symbol sequence, the encoding device is configured to:

determine the symbols of the symbol sequence based on the symbol probabilities, wherein the symbols of the transmit signal have the target distribution.

3. The encoding device according to claim 1, wherein the target distribution of the symbols of the transmit signal is a truncated Gaussian distribution.

4. The encoding device according to claim 1, wherein for encoding the message into the symbol sequence, the encoding device is configured to:

select the symbols of the symbol sequence from symbols of a discrete symbol alphabet, wherein the symbols of the discrete symbol alphabet have the symbol probabilities depending on the effective interference.

5. The encoding device according to claim 4, wherein for encoding the message into the symbol sequence, the encoding device is configured to:

convert the symbol probabilities of the symbols of the discrete symbol alphabet into log-likelihood ratios; and perform a joint channel coding and probability shaping of the message based on the log-likelihood ratios to obtain the symbol sequence.

6. The encoding device according to claim 4, wherein the symbols of the discrete symbol alphabet are provided with a bit labelling, and wherein the bit labelling comprises a natural labelling or a Gray labelling.

7. The encoding device according to claim 6, wherein for encoding the message into the symbol sequence, the encoding device is configured to:

determine the symbols of the symbol sequence based on the bit labelling of the symbols of the discrete symbol alphabet.

8. The encoding device according to claim 1, wherein the effective interference further includes a uniformly distributed dither signal.

9. The encoding device according to claim 1, wherein for encoding the message into the symbol sequence, the encoding device is configured to:

divide the message into a plurality of sub-messages;

encode each sub-message of the plurality of sub-messages into a codeword, wherein a first set of the plurality of sub-messages is encoded into a first codeword set and a second set of the plurality of sub-messages is encoded, based on the first codeword set and the effective interference, into a second codeword set; and map codewords of the first codeword set and the second codeword set into corresponding symbols to obtain the symbol sequence.

10. The encoding device according to claim 9, further configured to encode the second set of the plurality of sub-messages into the second codeword set by using a channel decoder.

11. The encoding device according to claim 9, further configured to encode each sub-message of the plurality of sub-messages into the codeword based on log-likelihood ratios of a set of candidate codewords.

12. The encoding device according to claim 1, wherein obtaining the transmit signal based on the mapping of the symbol sequence and the effective interference using the scalar function comprises:

obtaining a second symbol sequence based on the symbol sequence and the effective interference; and obtaining the transmit signal by applying the scalar function on the second symbol sequence.

13. The encoding device according to claim 1, wherein encoding the message into the symbol sequence comprises polar encoding, and the encoding device is further configured to:

notify a receiver at least one of a number of shaping bits or an allocation of the shaping bits.

14. The encoding device according to claim 1, wherein the DPC scheme is based on probabilistic shaping.

15. An encoding method, wherein the encoding method comprises:

obtaining, in a dirty paper coding (DPC) scheme, symbol probabilities for symbols of a symbol sequence given an effective interference based on a target distribution of symbols of a transmit signal;

encoding, in the DPC scheme, a message into the symbol sequence based on the symbol probabilities; and obtaining, in the DPC scheme, the transmit signal based on a mapping of the symbol sequence and the effective interference using a scalar function, wherein the scalar function comprises a scalar modulo operation.

16. The encoding method according to claim 15, wherein encoding the message comprises:

determining the symbols of the symbol sequence based on the symbol probabilities, wherein the symbols of the transmit signal have the target distribution.

* * * * *